United States Patent
Lin et al.

(10) Patent No.: US 7,141,337 B2
(45) Date of Patent: Nov. 28, 2006

(54) PHASE SHIFT MASK

(75) Inventors: Chin-Lung Lin, Hsin-Chu Hsien (TW); Chuen-Huei Yang, Taipei (TW); Ming-Jui Chen, Hsin-Chu (TW); Wen-Tien Hung, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 179 days.

(21) Appl. No.: 10/249,372

(22) Filed: Apr. 3, 2003

(65) Prior Publication Data

US 2004/0197671 A1 Oct. 7, 2004

(51) Int. Cl.
*G01F 9/00* (2006.01)
(52) U.S. Cl. ............................................. 430/5
(58) Field of Classification Search ............... 430/5, 430/394, 322–324
See application file for complete search history.

(56) References Cited

U.S. PATENT DOCUMENTS

| 6,114,095 | A | * | 9/2000 | Nakabayashi et al. | ....... 430/311 |
| 6,150,058 | A | * | 11/2000 | Tu et al. | .......................... 430/5 |
| 6,210,841 | B1 | * | 4/2001 | Lin et al. | .......................... 430/5 |
| 6,582,858 | B1 | * | 6/2003 | Lai et al. | .......................... 430/5 |

* cited by examiner

*Primary Examiner*—S. Rosasco
(74) *Attorney, Agent, or Firm*—Winston Hsu (57) ABSTRACT

A phase shift mask includes a transparent substrate, a semi-dense pattern, and a dense pattern. The semi-dense pattern is formed on the transparent substrate including a plurality of phase shift regions and non-phase shift regions arranged successively. The dense pattern is formed on the transparent substrate including a plurality of non-phase shift regions, phase shift regions, and non-transparent regions.

13 Claims, 9 Drawing Sheets

PHASE SHIFT MASK

BACKGROUND OF INVENTION

1. Field of the Invention

The present invention relates to a phase shift mask (PSM), and more particularly, to a phase shift mask simultaneously having a structure of a selective chromeless phase shift mask and a structure of an alternating phase shift mask.

2. Description of the Prior Art

In circuit making processes, a lithographic process has not only been a mandatory technique but also played an important role in limiting feature size. Only by a lithographic process can a wafer producer precisely and clearly transfer a circuit pattern onto a semiconductor wafer. In a lithographic process, a designed pattern, such as a circuit pattern or a doping pattern, is created on one or several photo masks, then the pattern on the mask is transferred by light exposure, with a stepper and scanner, onto a semiconductor wafer.

Figure 1:
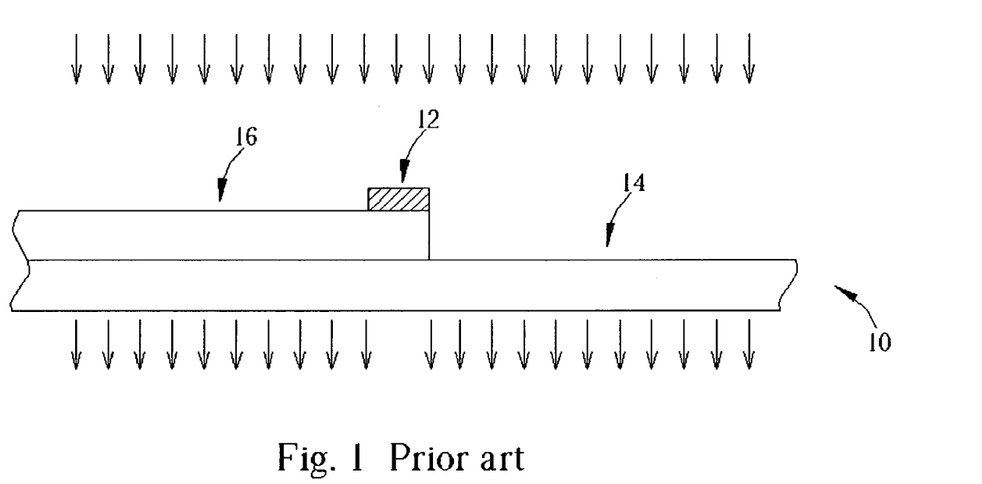
FIG. 1 is a structural diagram of a prior art alternating phase mask.

It is an important issue for solving resolution of the lithographic process due to the device sizes of the semiconductor industry are being reduced. There are primarily two methods in the prior art for improving resolution. One method involves using short wavelengths of light to expose a photoresist layer on the semiconductor wafer. Short wavelengths of light are desirable as the shorter the wavelength, the higher the possible resolution of the pattern. Another method involves the use of a phase shift mask (PSM) to improve the resolution of the pattern transferred to the semiconductor wafer. Please refer to FIG. 1, which is a structural diagram of a prior art alternating phase mask 10. As shown in FIG. 1, a fully opaque material such as chrome is used in a non-transparent region 12 of the alternating phase shift mask 10, and the non-transparent region 12 is flanked by transparent regions 14, 16. Both of the transparent regions 14, 16 are made of quartz. The thickness of the transparent region 14 is approximately 2280 Angstroms less than that of the transparent region 16. Therefore, light passing through the transparent region 14 has a phase shift of 180 degrees relative to light passing through the thicker transparent region 16, which results in destructive interference. Consequently, during the lithographic process, a dark unexposed region falls on an area of a photoresist layer and is located below the non-transparent region 12 of the alternating phase shift mask 10.

However, the alternating phase shift mask 10 has to perform a double exposure lithography technique employing a trim mask to complete pattern transferring. Additionally, the alternating phase shift mask 10 suffers from transmission imbalance occurred in the phase shift region, i.e. the transparent region 14, and the non-phase shift region, i.e. the transparent region 16.

Figure 2:
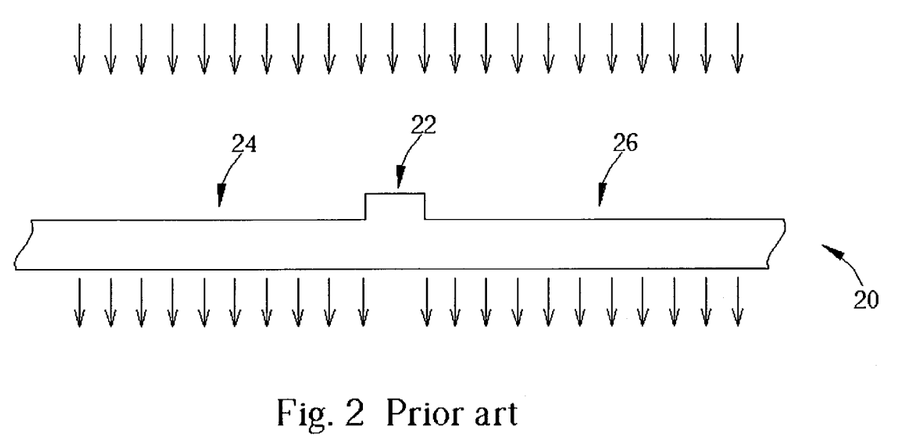
FIG. 2 is a structural diagram of a prior art selective chromeless phase shift mask.

Therefore, a selective chromeless phase shift mask is developed. Please refer to FIG. 2, which is a structural diagram of a prior art selective chromeless phase shift mask 20. As shown in FIG. 2, the selective chromeless phase shift mask comprises a transparent region 22 made of quartz, and the transparent region 22 is flanked by two transparent regions 24, 26 also made of quartz. The transparent region 22 is thicker than both the transparent regions 24, 26, which causes a 180 degree phase shift in light passing through the transparent regions 24, 26. In other words, the transparent regions 24, 26 are phase shift regions, and the transparent region 22 is a non-phase shift region. Because of this 180 degrees phase difference, there is destructive interference at the phase boundaries of the phase shift regions 24, 26 and the non-phase shift region 22. Consequently, during the lithographic process, a dark unexposed region falls on an area of a photoresist layer and is located below the non-phase shift region 22 of the selective chromeless phase shift mask 20.

However, with the increase of packing density of devices, a pitch between each device is reducing. Unfortunately, when the pitch is less than twice of a width of the device and forms a dense pattern, light of 0 degree phase shift and light of 180 degrees phase shift cancel out. Therefore, the prior art selective chromeless phase shift mask fails to transfer the dense pattern.

SUMMARY OF INVENTION

It is therefore an objective of the claimed invention to providea phase shift mask for solving the above-mentioned problems of the prior art alternating phase shift mask and the prior art selective chromeless phase shift mask.

A phase shift mask is provided according to the claimed invention, which comprises a transparent substrate, a semi-dense pattern and a dense pattern. The semi-dense pattern is formed on the transparent substrate including a plurality of phase shift regions and non-phase shift regions arranged successively. The dense pattern is formed on the transparent substrate including a plurality of non-phase shift regions, phase shift regions and non-transparent regions.

The phase shift mask of the present invention combines a structure of the prior art alternating phase shift mask and a structure of the prior art selective chromeless phase shift mask. In other words, the phase shift mask of the present invention comprises a dense pattern formed on the structure of the alternating phase shift mask and a semi-dense pattern formed on the structure of the selective chromeless phase shift mask. Therefore, the phase shift mask of the present invention can improve the disadvantage of transmission imbalance occurred in the phase shift region and the non-phase shift region of the alternating phase shift mask and simultaneously solve the problem of the selective chromeless phase shift mask failing to transfer a dense pattern.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 3:
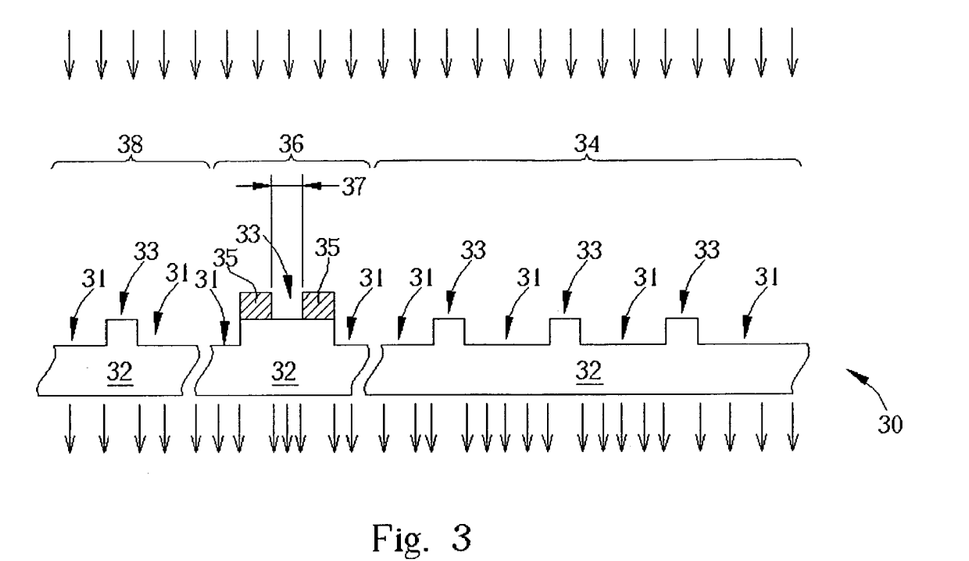
FIG. 3 is a structural diagram of a phase shift mask of the present invention.

Please refer to FIG. 3, which is a structural diagram of a phase shift mask of the present invention. As shown in FIG. 3, the phase shift mask 30 comprises a transparent substrate 32 made of quartz, a semi-dense pattern 34 and a dense pattern 36. The semi-dense pattern 34 is formed on the transparent substrate 32 including a plurality of phase shift regions 31 and non-phase shift regions 33 arranged successively. The dense pattern 36 is also formed on the transparent substrate 32 including a plurality of phase shift regions 31, non-phase shift regions 33, and non-transparent regions 35 made of chrome. In the semi-dense pattern 34, a width of each phase shift region 31 is at least twice of a width of each non-phase shift region 33. However, a predetermined interval 37 is formed between each non-transparent region 35 of the dense pattern 36, and a width of the predetermined interval 37 is smaller than twice of a width of the non-transparent region 35.

According to the phase shift mask 30 of the present invention, a thickness of the transparent substrate 32 in the phase shift regions 31 is smaller than a thickness of the transparent substrate 32 in the non-phase shift regions 33, and light passing through the phase shift regions 31 has a phase shift of 180 degree relative to light passing through the non-phase shift regions 33. Because of this 180 degrees phase difference, there is destructive interference at the phase boundaries of the phase shift regions 31 and the non-phase shift regions 33. Consequently, during the lithographic process, a dark unexposed region falls on an area of a photoresist layer and is located below the non-transparent region 35 of the dense pattern 36, and a dark unexposed region falls on an area of a photoresist layer and is located below the non-phase shift region 33 of the semi-dense pattern 34.

Additionally, the phase shift mask 30 further comprises an isolated pattern 38 formed on the transparent substrate 32. The isolated pattern 38 includes a phase shift region 31, a non-phase shift region 33 and another phase shift region 31 arranged successively. As well, because light passing through the phase shift region 31 has a phase shift of 180 degrees relative to light passing through the non-phase shift region 33 causing a destructive interference, a dark unexposed region falls on an area of a photoresist layer and is located below the non-phase shift region 33 of the isolated pattern 38 during the lithographic process.

Figure 4:
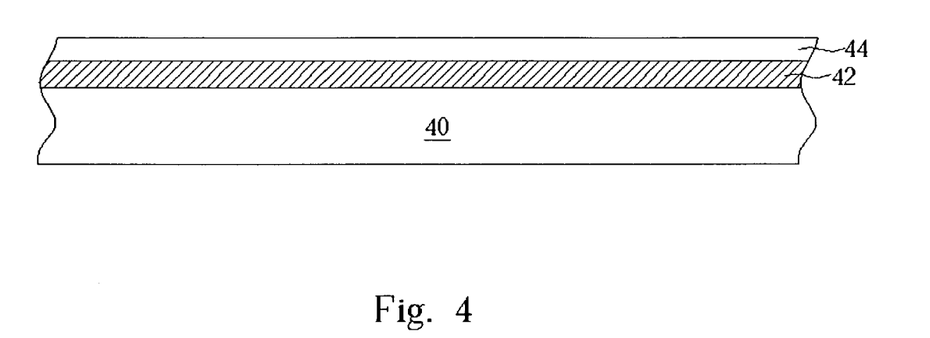
FIG. 4 to FIG. 9 are schematic diagrams of fabricating the phase shift mask of the present invention.
Figure 5:
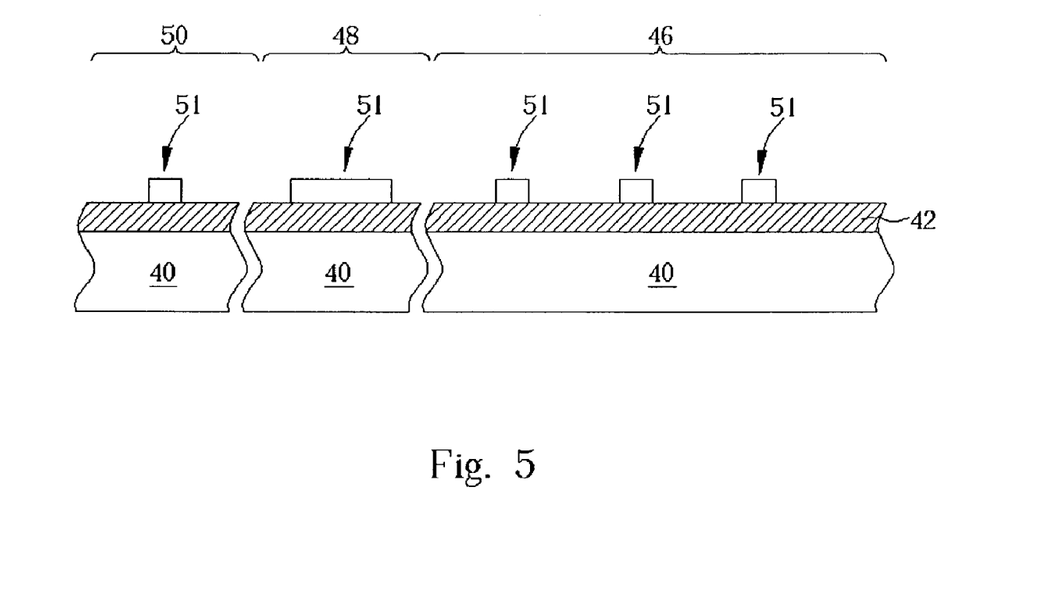
Figure 6:
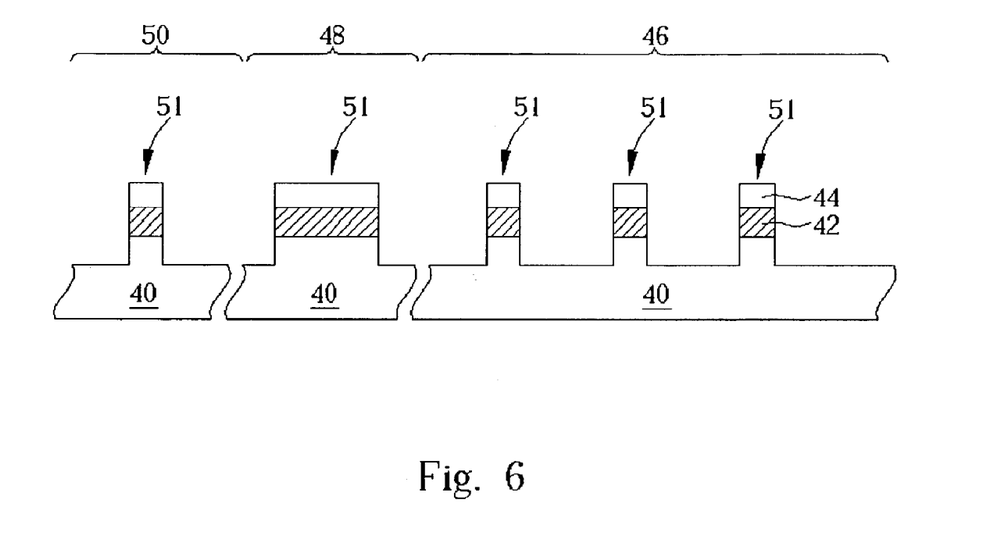
Figure 7:
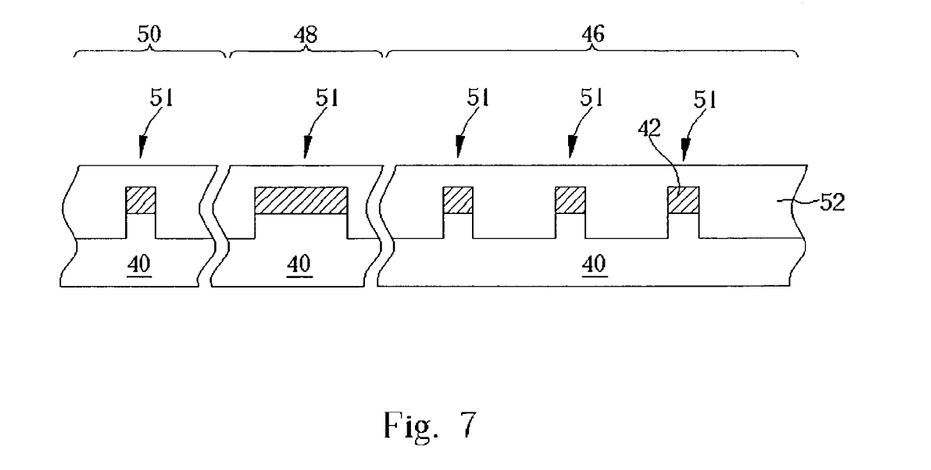
Figure 8:
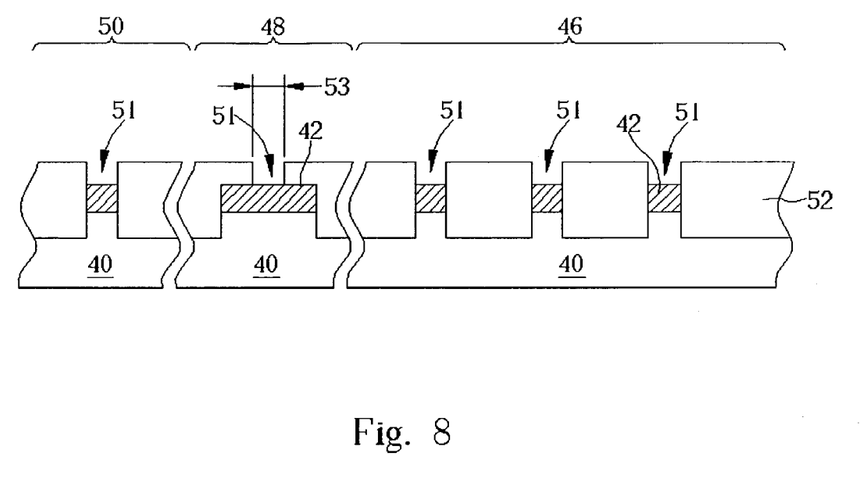
Figure 9:
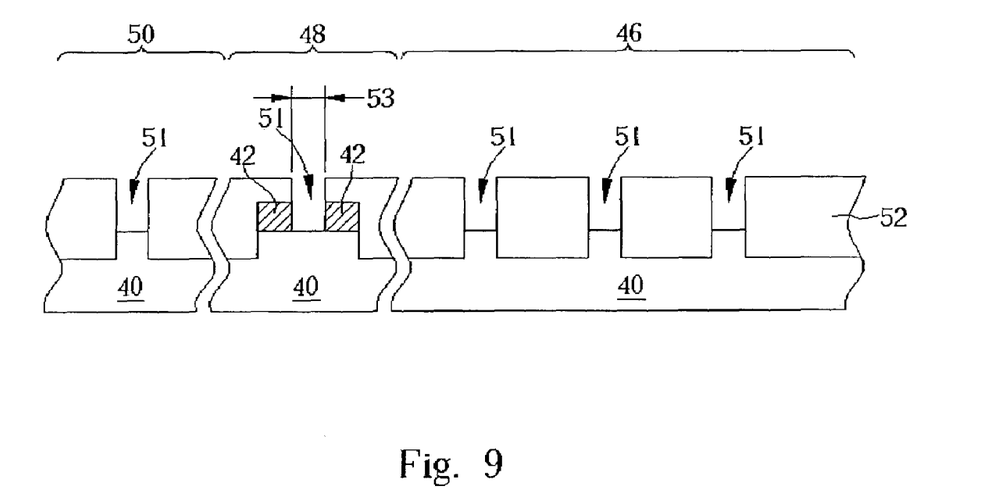

The fabricating method of the phase shift mask 30 of the present invention is the same as the fabricating method of the prior art selective chromeless phase shift mask. Please refer to FIG. 4 to FIG. 9, which are schematic diagrams of fabricating the phase shift mask 30 of the present invention. As shown in FIG. 4, a chrome layer 42 and a photo resist layer 44 are formed on a transparent substrate 40 made of quartz. As shown in FIG. 5, a lithographic process is performed, which uses the photoresist layer 44 to define non-phase shift regions 51 of a semi-dense pattern 46, a dense pattern 48 and an isolated pattern 50. Thereafter, as shown in FIG. 6, an etching process is performed to remove the chrome layer 42 not covered by the photoresist layer 44 and further remove the transparent substrate 40 until a predetermined depth. As shown in FIG. 7, the photoresist layer 44 is stripped and the transparent substrate 40 is covered with a blanket of another photoresist layer 52. As shown in FIG. 8, a portion of the photoresist layer 52 is removed for exposing the chrome layer 42 on the non-phase shift regions 51 of the semi-dense pattern 16 and the isolated pattern 50, and simultaneously exposing a portion of the chrome layer 42, which is predetermined to form an interval 53, on the non-phase shift regions 51 of the dense pattern 48. Finally, as shown in FIG. 9, the chrome layer 42 not covered by the photoresist layer 52 is removed during an etching process, and the photoresist layer 52 is stripped to complete the phase shift mask 30 of the present invention.

The phase shift mask of the present invention combines a structure of the prior art alternating phase shift mask and a structure of the prior art selective chromeless phase shift mask. In other words, the phase shift mask of the present invention comprises a dense pattern formed on the structure of the alternating phase shift mask and a semi-dense pattern formed on the structure of the selective chromeless phase shift mask. Therefore, the phase shift mask of the present invention can improve on the problem of transmission imbalance occurring in the phase shift region and the non-phase shift region of the alternating phase shift mask and simultaneously solve the problem of the selective chromeless phase shift mask failing to transfer a sense pattern. Additionally, the fabricating method of the phase shift mask of the present invention is the same as the fabricating method of the prior art selective chromeless phase shift mask. Consequently, the fabrication of the phase shift mask of the present invention does not require extra processes or equipments, which prevents the cost from increasing.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A phase shift mask (PSM) comprising:
   a transparent substrate;
   a semi-dense pattern formed on the transparent substrate, the semi-dense pattern consisting of a plurality of first phase shift regions and first non-phase shift regions arranged alternatively and being adjacent to each other, the first phase shift regions and the first non-phase shift regions being transparent and all of the first phase shift regions having a substantially same phase difference relative to the first non-phase shift regions; and
   a dense pattern formed on the transparent substrate, the dense pattern including a plurality of second non-phase shift regions, second phase shift regions, and non-transparent regions, such that each non-transparent region is between and adjacent to one of the second phase shift regions and one of the second non-phase shift regions.

2. The phase shift mask of claim 1 wherein the transparent substrate is composed of quartz.

3. The phase shift mask of claim 1 wherein the non-transparent regions are composed of chrome.

4. The phase shift mask of claim 1 wherein a thickness of the transparent substrate in the first and second phase shift regions is smaller than a thickness of the transparent substrate in the first and second non-phase shift region, and light passing through the first and second phase shift regions has a phase shift of 180 degrees relative to light passing through the first and second non-phase shift region.

5. The phase shift mask of claim 1 wherein the interval between two successive non-transparent regions of the dense pattern is smaller than twice of a width of the non-transparent region.

6. The phase shift mask of claim 1 wherein in the semi-dense pattern, a width of each first phase shift region is at least twice of a width of each first non-phase shift region.

7. The phase shift mask of claim 1 further comprising an isolated pattern formed on the transparent substrate, and the isolated pattern includes a phase shift region, a non-phase shift region, and another phase shift region arranged successively.

8. A phase shift mask (PSM) simultaneously having a structure of a selective chromeless phase shift mask and a structure of an alternating phase shift mask, the PSM comprising:
- a transparent substrate;
- a semi-dense pattern formed on the transparent substrate, the semi-dense pattern consisting of a plurality of first phase shift regions and first non-phase shift regions arranged alternatively and being adjacent to each other, the first phase shift regions and first non-phase shift regions being transparent and all of the first phase shift regions having a substantially same phase difference relative to the first non-phase shift regions; and
- a dense pattern formed on the transparent substrate, the dense pattern including a plurality of second non-phase shift regions, second phase shift regions, and non-transparent regions, such that each non-transparent region is between and adjacent to one of the second phase shift regions and one of the second non-phase shift regions,
- wherein the interval between two successive non-transparent regions of the dense pattern is smaller than twice of a width of the non-transparent region.

9. The phase shift mask of claim 8 wherein the transparent substrate is composed of quartz.

10. The phase shift mask of claim 8 wherein the non-transparent regions are composed of chrome.

11. The phase shift mask of claim 8 wherein a thickness of the transparent substrate in the first and second phase shift regions is smaller than a thickness of the transparent substrate in the first and second non-phase shift region, and light passing through the first and second phase shift regions has a phase shift of 180 degrees relative to light passing through the first and second non-phase shift region.

12. The phase shift mask of claim 8 wherein in the semi-dense pattern, a width of each first phase shift region is at least twice of a width of each first non-phase shift region.

13. The phase shift mask of claim 8 further comprising an isolated pattern formed on the transparent substrate, and the isolated pattern includes a phase shift region, a non-phase shift region, and another phase shift region arranged successively.

* * * * *